(12) United States Patent
Tan et al.

(10) Patent No.: US 12,812,916 B2
(45) Date of Patent: Nov. 24, 2026

(54) DISPLAY PANELS, METHODS OF MANUFACTURING A DISPLAY PANEL, AND DISPLAY DEVICES

(71) Applicant: Shenzhen China Star Optoelectronics Semiconductor Display Technology Co., Ltd., Shenzhen (CN)

(72) Inventors: Jincheng Tan, Shenzhen (CN); Zhongjie Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 336 days.

(21) Appl. No.: 18/531,776

(22) Filed: Dec. 7, 2023

(65) Prior Publication Data

US 2025/0142885 A1 May 1, 2025

(30) Foreign Application Priority Data

Oct. 27, 2023 (CN) ......................... 202311419025.0

(51) Int. Cl.
*H10D 30/67* (2025.01)
*H10D 30/01* (2025.01)

(52) U.S. Cl.
CPC ..... *H10D 30/6739* (2025.01); *H10D 30/0316* (2025.01); *H10D 30/0321* (2025.01); *H10D 30/6757* (2025.01)

(58) Field of Classification Search
CPC ........... H10D 30/6739; H10D 30/0316; H10D 30/0321; H10D 30/6757; H10D 30/6732;

(Continued)

(56) References Cited

U.S. PATENT DOCUMENTS

| | | | | |
|---|---|---|---|---|
| 9,741,557 B1 * | 8/2017 | Dellas | H10P 14/6339 | |
| 2009/0159884 A1 * | 6/2009 | Oda | H10D 30/6739 | 438/151 |

FOREIGN PATENT DOCUMENTS

| | | |
|---|---|---|
| CN | 114300541 A | 4/2022 |

OTHER PUBLICATIONS

K. Czarnacka et al. “AC measurements and dielectric properties of nitrogen-rich silicon nitride thin films,” 2017 IEEE 7th International Conference Nanomaterials: Application & Properties (NAP), Odessa, UKraine, 2017, pp. 02NTF34-1-02NTF34-4, doi: 10.1109/NAP.2017.8190390 (Year: 2017).*

(Continued)

*Primary Examiner* — Sitaramarao S Yechuri
(74) *Attorney, Agent, or Firm* — PV IP PC; Christopher S. Ruprecht; Wei Te Chung

(57) ABSTRACT

Display panels, methods of manufacturing a display panel, and display devices are provided. The display panel includes a substrate and a thin film transistor layer disposed on the substrate. The thin film transistor layer includes a gate, a gate insulating layer and an active layer; the gate is disposed on the substrate; the gate insulating layer is disposed on the substrate and covers the gate; and the active layer is disposed on a side of the gate insulating layer away from the gate. The gate insulating layer includes an electron suppressing layer at least covering a side of the gate away from the substrate and an electron blocking layer disposed on a side of the electron suppressing layer away from the gate, and a ratio of nitrogen to silicon in the electron suppressing layer is greater than 0.95.

18 Claims, 7 Drawing Sheets

(58) Field of Classification Search
CPC ...... H10D 86/021; H10D 86/40; H10D 86/60; H10D 64/685
See application file for complete search history.

(56) References Cited

OTHER PUBLICATIONS

Sahu BS et al., Effect of annealing treatments on photoluminescence and charge storage mechanism in silicon-rich SiNx:H films. Nanoscale Res Lett. Feb. 28, 2011;6(1):178. doi: 10.1186/1556-276X-6-178 (Year: 2011).*
U.S. Appl. No. 63/550,943, B1, filed Mar. 12, 2002, Sung Chae Gee.
Chinese Office Action issued in corresponding Chinese Patent Application No. 202311419025.0 dated Sep. 23, 2026, pp. 1-6.
ECS Transactions, vol. 35, No. 4, pp. 73-79, Issue Dec. 31, 2011, Impact of silicon nitride gate dielectric composition on the stability of low temperature nanocrystalline silicon thin film transistors, Mohammad Esmaeili-Rad, etc.

* cited by examiner

DISPLAY PANELS, METHODS OF MANUFACTURING A DISPLAY PANEL, AND DISPLAY DEVICES

CROSS-REFERENCE TO RELATED APPLICATION

This application claims priority to and the benefit of Chinese Patent Application No. 202311419025.0, filed on Oct. 27, 2023, the disclosure of which is incorporated herein by reference in its entirety.

TECHNICAL FIELD

The present disclosure relates to display technologies, and in particular, to display panels, methods of manufacturing a display panel and display devices.

BACKGROUND

With a development of manufacturing technology of display panels, requirements for the display effect and comprehensive performance of display panels are getting higher.

In a process of manufacturing a display panel, it is generally necessary to manufacture an array substrate and form a plurality of thin film transistors in the array substrate. When the display panel operates normally, different thin film transistors provide corresponding driving control signals to the display panel, thereby ensuring the normal operation of the display panel. Therefore, performances of thin film transistors in the array substrate have a great impact on the display performance.

At present, a gate insulating layer is generally disposed between a gate and an active layer of a thin film transistor to play the role of isolation. However, due to environmental effects, such as strong light environments, gate electrons can easily jump into the gate insulating layer, and thus affecting an on-state voltage of the thin film transistor and affecting the display effect of the display panel.

SUMMARY

Embodiments of the present disclosure provide a display panel, a method of manufacturing a display panel, and a display device, which can reduce the probability of gate electrons jumping into the gate insulating layer, thereby improving electrical properties of thin film transistors in a thin film transistor layer, and improving the display effect of the display panel.

An embodiment of the present disclosure further provides a display panel, the display panel includes a substrate and a thin film transistor layer disposed on the substrate, and the thin film transistor layer includes:

a gate disposed on the substrate;

a gate insulating layer disposed on the substrate and covering the gate;

an active layer disposed on a side of the gate insulating layer away from the gate;

the gate insulating layer includes an electron suppressing layer at least covering a side of the gate away from the substrate and an electron blocking layer disposed on a side of the electron suppressing layer away from the gate, and a ratio of nitrogen to silicon in the electron suppressing layer is greater than 0.95.

According to an object of the present disclosure described above, an embodiment of the present disclosure also provides a method of manufacturing a display panel, including:

forming a gate on a substrate;

forming an electron suppressing layer at least on a side of the gate away from the substrate, and a ratio of nitrogen to silicon in the electron suppressing layer is greater than 0.95;

forming an electron blocking layer on a side of the electron suppressing layer away from the gate to form a gate insulating layer;

forming an active layer on a side of the electron blocking layer away from the electron suppressing layer.

According to an object of the present disclosure described above, an embodiment of the present disclosure further provides a display device, and the display device includes any of the display panel described above.

BRIEF DESCRIPTION OF THE DRAWINGS

Technical solutions and other advantageous effects of the present disclosure will become apparent through a detailed description of specific embodiments of the present disclosure below with reference to the accompanying drawings.

DETAILED DESCRIPTION

Technical solutions in embodiments of the present disclosure will be clearly and completely described below with reference to the accompanying drawings in embodiments of the present disclosure. It is apparent that embodiments described herein are only some of the embodiments of the present disclosure, but not all of the embodiments of the present disclosure. Based on embodiments of the present disclosure, all other embodiments obtained by those skilled in the art without making creative efforts fall within the scope of protection of the present disclosure.

Many different embodiments or examples are provided in the following disclosure to achieve various structures of the present disclosure. In order to simplify the disclosure of the present disclosure, components and arrangements of specific examples are described below. Apparently, they are merely examples and are not intended to limit the present disclosure. Furthermore, reference numbers and/or reference letters may be repeated in different examples of the present disclosure, and such repetition is for the purpose of simplicity and clarity and does not itself indicate a relationship between various embodiments and/or arrangements discussed. In addition, examples of various specific processes and materials are provided in the present disclosure, but those skilled in the art will recognize the application of other processes and/or the use of other materials.

Figure 1:
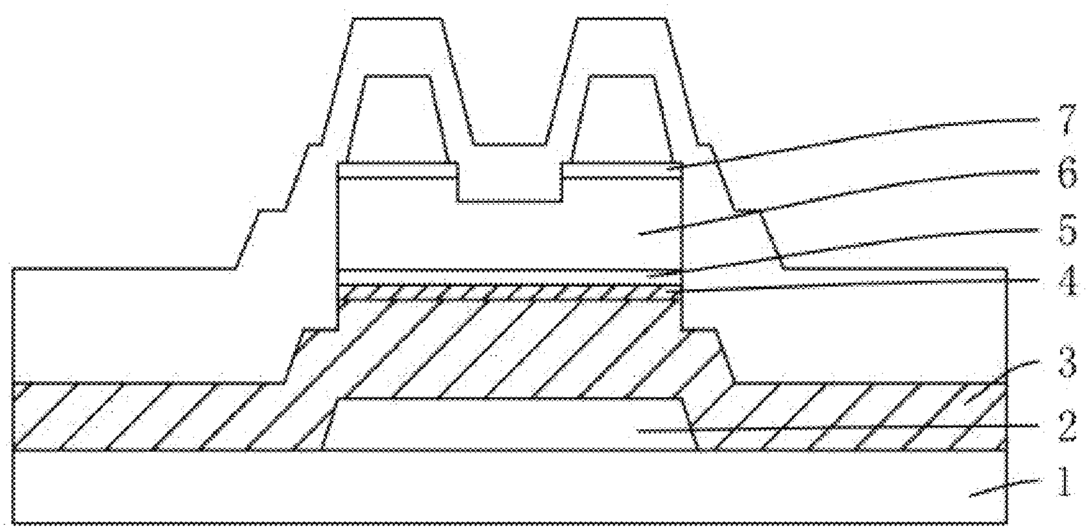
FIG. 1 is a schematic structural diagram of a structure of a display panel provided in the related art.
Figure 2:
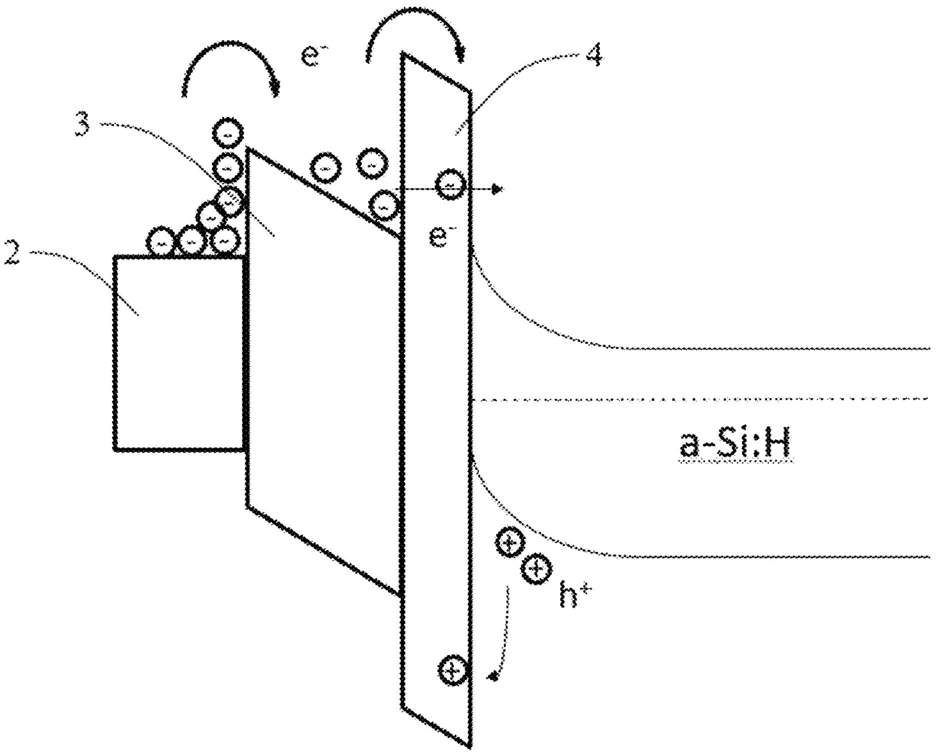
FIG. 2 is a schematic diagram of electronic transition of a gate insulating layer in a display panel provided in the related art.

Referring to FIG. 1 and FIG. 2, a display panel provided by the related art includes a substrate 1, a gate 2 disposed on the substrate 1, a gate insulating layer covering the gate 2, and an active layer disposed on the gate insulating layer. The gate insulating layer includes a first insulating layer 3 and a second insulating layer 4 disposed in a stacked manner. The active layer includes a blocking layer 5, a semiconductor layer 6 and an Ohmic contact layer 7 disposed in a stacked manner. In the gate insulating layer, the first insulating layer 3 covers on the surface of the gate 2. Therefore, under the influence of a strong light environment or negative bias temperature illumination stress (NBTIS), gate electrons are prone to appear electron transition and jump into the gate insulating layer. Due to process reasons, the first insulating layer 3 has a fast deposition rate and a relatively large thickness, and the film layer structure of the first insulating layer 3 is relatively loose and contains relatively more defects. The ratio of nitrogen to silicon of the first insulating layer is generally less than 0.95, resulting in a low optical band gap. While the second insulating layer 4 has a lower depositing rate, a film layer structure of the second insulating layer 4 is relatively dense and contains fewer defects, and the second insulating layer 4 has a higher optical band gap. Therefore, gate electrons are prone to jump into the first insulating layer 3 and are blocked by the second insulating layer 4, such that gate electrons accumulate at the second insulating layer 4 and form a bias voltage, thereby affecting the on-state voltage of the active layer. For example, a higher voltage needs to be applied to the gate 2 to make the active layer in an on-state, and thus affecting the stability and display effect of the display panel.

Figure 3:
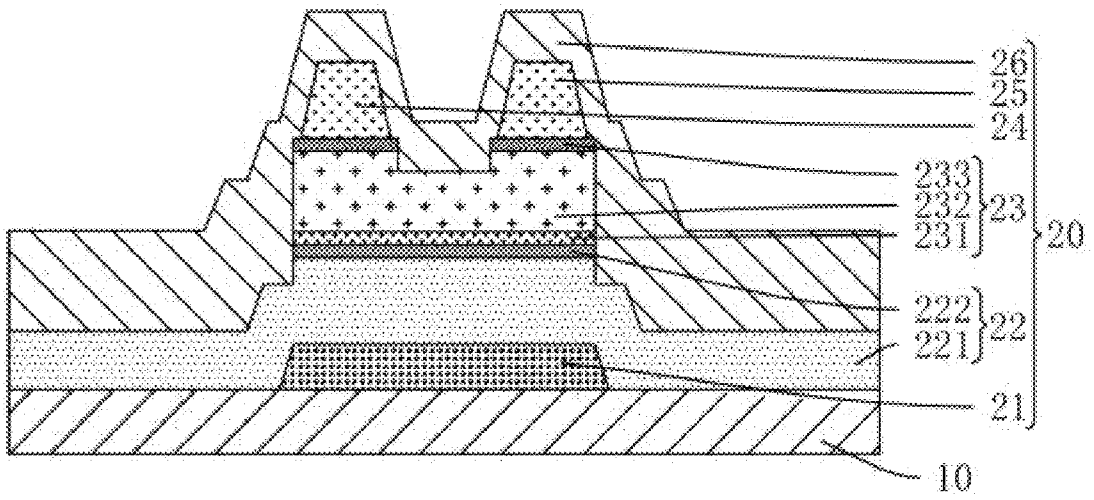
FIG. 3 is a schematic structural diagram of a structure of a display panel provided by an embodiment of the present disclosure.
Figure 4:
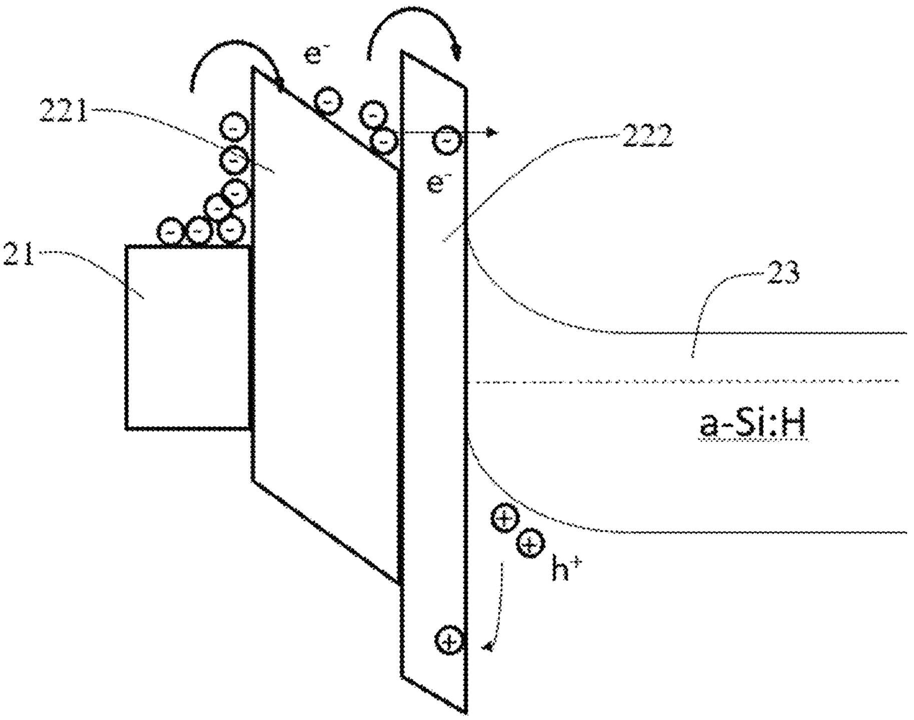
FIG. 4 is a schematic diagram of electronic transition of a gate insulating layer in a display panel provided by another embodiment of the present disclosure.

An embodiment of the present disclosure also provides a display panel. Referring to FIG. 3 and FIG. 4, the display panel includes a substrate 10 and a thin film transistor layer 20 disposed on the substrate 10.

The thin film transistor layer 20 includes a gate 21, a gate insulating layer 22 and an active layer 23. The gate 21 is disposed on the substrate 10, and the gate insulating layer 22 is disposed on the substrate 10 and covers the gate 21. The active layer 23 is disposed on a side of the gate insulating layer 22 away from the gate 21.

Further, the gate insulating layer 22 includes an electron suppressing layer 221 at least covering a side of the gate 21 away from the substrate 10 and an electron blocking layer 222 disposed on a side of the electron suppressing layer 221 away from the gate 21, and a ratio of nitrogen to silicon in the electron suppressing layer 221 is greater than 0.95.

During the implementation and application, in some embodiments of the present disclosure, an electron suppressing layer 221 is disposed on a side of the gate 21 away from the substrate 10, and a ratio of nitrogen to silicon in the electron suppressing layer 221 is greater than 0.95, which improve the optical band gap of the electron suppressing layer 221, and reduce the possibility that gate electrons jump into the gate insulating layer 22, so as to further avoid that a large number of gate electrons accumulate in the gate insulating layer 22 and affect the on-state voltage of the active layer 23, and thus increasing the stability of thin film transistors in the thin film transistor layer 20 and improving the display effect of the display panel.

Specifically, in an embodiment of the present disclosure, continually referring to FIG. 3 and FIG. 4, the display panel includes a substrate 10 and a thin film transistor layer 20 disposed on the substrate 10. The thin film transistor layer 20 includes a gate 21 disposed on the substrate 10, a gate insulating layer 22 covering the gate 21, an active layer 23 disposed on a side of the gate insulating layer 22 away from the gate 21, a source 24 and a drain 25 disposed on the active layer 23, and an interlayer dielectric layer 26 covering the active layer 23, the source 24, and the drain 25. The gate 21, the active layer 23, the source 24 and the drain 25 constitute a thin film transistor.

Further, the active layer 23 is disposed above the gate 21 and includes a blocking layer 231, a semiconductor layer 232 and an Ohmic contact layer 233 disposed in a stacked manner. The blocking layer 231 is disposed between the semiconductor layer 232 and the gate 21, and the Ohmic contact layer 233 is disposed on the side of the semiconductor layer 232 away from the blocking layer 231. It should be noted that the blocking layer 231 is disposed between the semiconductor layer 232 and the gate insulating layer 22, and the film layer structure of the blocking layer 231 is relatively dense and contains fewer defects, which can effectively reduce the possibility that electrons jump into the active layer 23, so as to improve the stability of thin film transistors, and thus improving the stability and display effect of the display panel. In addition, the source 24 and the drain 25 are respectively disposed on the upper surface of the active layer 23 and disposed oppositely, and are in contact with the Ohmic contact layer 233 to realize the electrical connection between the source 24, the drain 25 and the active layer 23. Further, in the thin film transistor, a voltage can be applied to the gate 21 to form a current channel in the semiconductor layer 232, thereby transmitting an electrical signal applied to one of the source 24 and the drain 25 to the other of the source 24 and the drain 25.

In an embodiment of the present disclosure, the gate insulating layer 22 includes an electron suppressing layer 221 and an electron blocking layer 222 disposed in a stacked manner. The electron suppressing layer 221 is disposed on a side of the gate 21 away from the substrate 10 and covers a surface of the side of the gate 21 away from the substrate 10. The electron blocking layer 222 is disposed on a side of the electron suppressing layer 221 away from the gate 21 and is disposed between the electron suppressing layer 221 and the blocking layer 231.

In an embodiment, a material of the gate insulating layer 22 may include silicon nitride material. A material of the active layer 23 may include hydrogenated amorphous silicon (a-Si:H) materials. Materials of the gate 21, the source 24 and the drain 25 may be conductive metal materials. For example, the material of the gate 21 may include one or more of Mo, Al, Cu and Ti. The materials of the source 24 and the drain 25 may also include one or more of Mo, Al, Cu and Ti.

It should be noted that the film layer structure of the electron blocking layer 222 is relatively dense and has fewer defects, which can effectively block the electrons from jumping into the active layer 23. The ratio of nitrogen to silicon in the electron suppressing layer 221 is greater than 0.95 to increase the optical band gap of the electron suppressing layer 221, which can further effectively reduce the possibility that electrons in the gate 21 jump into the gate insulating layer 22 and reduce the accumulation of electrons at the electron blocking layer 21, thereby further reducing the impact of electronic transition on the open-state voltage of the thin film transistor and improving the stability of the thin film transistor, and improving the display effect of the display panel.

In an embodiment, the ratio of nitrogen to silicon of the electron suppressing layer 221 is greater than or equal to 1. Preferably, the ratio of nitrogen to silicon of the electron suppressing layer 221 is greater than or equal to 1.1 and less than or equal to 1.2. The optical band gap of the electron suppressing layer 221 is greater than or equal to 4.3. Further, the optical band gap of the electron suppressing layer 221 may be greater than or equal to 4.7.

It should be noted that embodiments of the present disclosure have verified that the ratio of nitrogen to silicon of the electron suppressing layer 221 is related to the deposition rate of the film layer, that is, the less the deposition rate of the film layer is, the greater the ratio of nitrogen to silicon of the electron suppressing layer 221 is. However, considering the factors of production efficiency and cost, if the ratio of nitrogen to silicon of the electron suppressing layer 221 is too large, the deposition rate of the electron suppressing layer 221 will be too small, which will reduce the production efficiency of the display panel and increase the production cost. Therefore, the ratio of nitrogen to silicon of the electron suppressing layer 221 in some embodiments of the present disclosure is less than or equal to 1.2, and thus, on the basis of effectively reducing the possibility of electron transitions, production efficiency and cost control can be guaranteed.

In an embodiment, the ratio of nitrogen to silicon in the electron blocking layer 222 is greater than the ratio of nitrogen to silicon in the electron suppressing layer 221. It should be noted that in practice, due to the influence of fluctuation in process, the ratio of nitrogen to silicon in the electron blocking layer 222 may be less than or equal to the ratio of nitrogen to silicon in the electron suppressing layer 221.

In an embodiment, the ratio of nitrogen to silicon of the electron blocking layer 222 is greater than or equal to 1.1 and less than or equal to 1.3, and the optical band gap in the electron blocking layer 222 may be 5.

It should be noted that in an embodiment of the present disclosure, a thickness of the electron suppressing layer 221 is greater than or equal to a thickness of the electron blocking layer 222. In some embodiments of the present disclosure, the electron suppressing layer 221 and the electron blocking layer 222 can be formed by controlling the deposition rate of materials of the gate insulating layer 22. The deposition rate of the electron suppressing layer 221 is greater than the deposition rate of the electron blocking layer 222. Therefore, in a case where the thickness of the electron suppressing layer 221 is greater than the thickness of the electron blocking layer 222, it can not only effectively reduce the possibility that gate electrons jump into the gate insulating layer 22, but also effectively reduce the process time of the display panel and increase production capacity.

Furthermore, the display panel provided in some embodiments of the present disclosure may be a liquid crystal display panel, and then the display panel may also include a color resisting layer, a pixel electrode layer, a common electrode layer, etc., which are disposed on the thin film transistor layer 20. The film layers mentioned above constitute an array substrate in the display panel, and the display panel may further include a color filter substrate disposed opposite to the array substrate and a liquid crystal layer disposed between the array substrate and the color filter substrate. It can be understood that in some embodiments of the present disclosure, improvement is made on the gate insulating layer 22, that is, improvement is made on one side of the array substrate in the display panel. The array substrate can also be applied to other types of display panels, for example, organic light-emitting diode display panel or LED display panel, which is not limited herein.

Following the above, in embodiments of the present disclosure, adding an electron suppressing layer 221 between the electron blocking layer 222 and the gate 21, and increasing the ratio of nitrogen to silicon in the electron suppressing layer 221 to improve the optical band gap of the electron suppressing layer 221, increase the difficulty of gate electrons jumping into the gate insulating layer 22, reduce the probability of gate electrons jumping into the gate insulating layer 22 and reduce the accumulation of electrons at the electron blocking layer 222, and thus, improving the stability of the thin film transistor and improving the display effect of the display panel.

Figure 5:
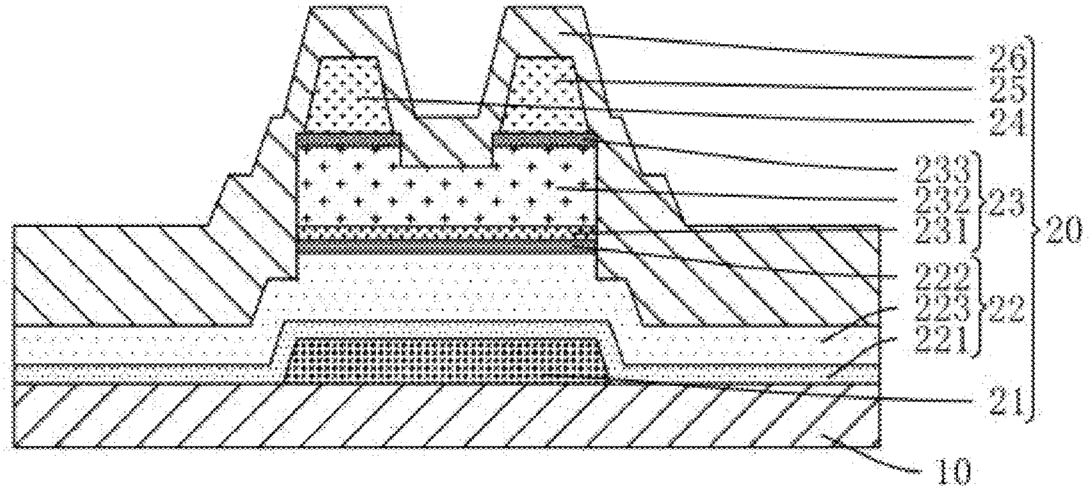
FIG. 5 is a schematic structural diagram of a display panel provided by another embodiment of the present disclosure.
Figure 6:
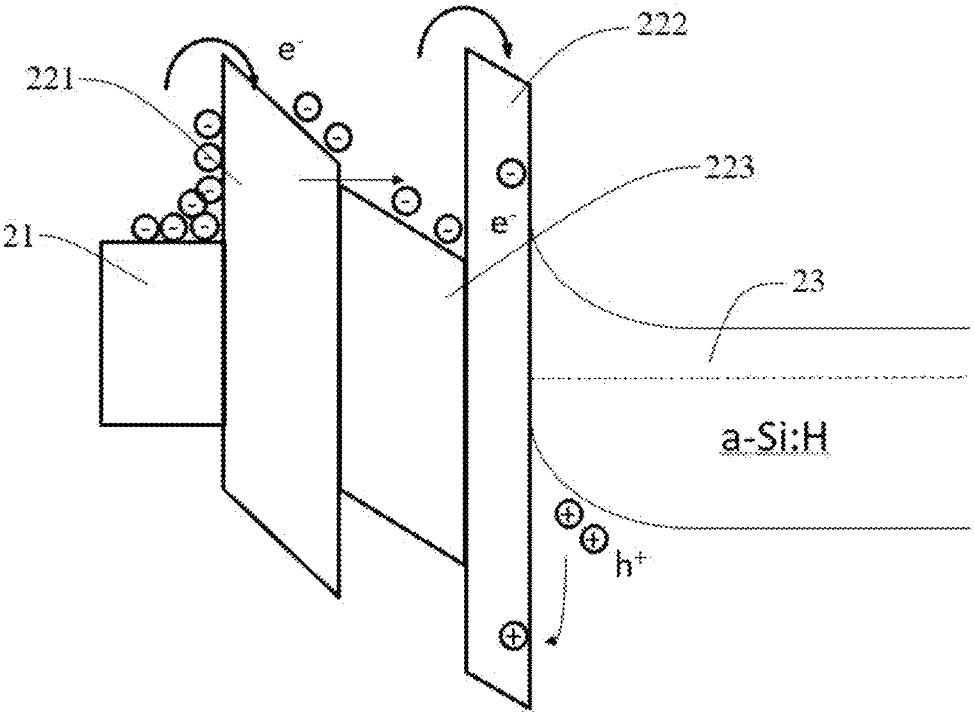
FIG. 6 is a schematic diagram of electronic transition of a gate insulating layer in a display panel provided by another embodiment of the present disclosure.

In another embodiment of the present disclosure, referring to FIG. 5 and FIG. 6, the difference between this embodiment and an embodiment shown in FIG. 3 is in that: the gate insulating layer 22 includes an electron suppressing layer 221, a spacer layer 223 and an electron blocking layer 222 disposed in a stacked manner. The electron suppressing layer 221 is disposed on the substrate 10 and covers a surface of a side of the gate 21 away from the substrate 10, the spacer layer 223 is disposed on a side of the electron suppressing layer 221 away from the gate 21, and the electron blocking layer 222 is disposed on a side of the spacer layer 223 away from the electron suppressing layer 221.

A ratio of nitrogen to silicon in the electron suppressing layer 221 is greater than a ratio of nitrogen to silicon in the spacer layer 223. In an embodiment, a ratio of nitrogen to silicon in the electron blocking layer 222 is greater than the ratio of nitrogen to silicon in the electron suppressing layer 221.

It should be noted that a thickness of the electron suppressing layer 221 is less than a thickness of the spacer layer 223, and the thickness of the electron suppressing layer 221 is greater than or equal to a thickness of the electron blocking layer 222. In some embodiments of the present disclosure, the electron suppressing layer 221, the spacer layer 223, and the electron blocking layer 222 can be formed by controlling the deposition rate of materials of the gate insulating layer 22. A deposition rate of the electron suppressing layer 221 is greater than a deposition rate of the electron blocking layer 222, a deposition rate of the spacer layer 223 is greater than the deposition rate of the electron suppressing layer 221. Therefore, in a case where the thickness of the electron suppressing layer 221 is greater than the thickness of the electron blocking layer 222, and the thickness of the spacer layer 223 is greater than the thickness of the electron suppressing layer 221, the possibility that gate electrons jump into the gate insulating layer 22 can be effectively reduced, while the process time of the display panel can be effectively reduced, thereby increasing productive capacity.

In an embodiment, the ratio of nitrogen to silicon of the spacer layer 223 is less than or equal to 0.95 and greater than or equal to 0.8, and the optical band gap of the spacer layer 223 may be 4.

It should be noted that the ratios of nitrogen to silicon in the electron suppressing layer 221, electron blocking layer 222 and spacer layer 223 mentioned above in embodiments of the present disclosure are ratios of atomic contents of nitrogen to silicon. Further, the ratio of nitrogen to silicon is a molar ratio of nitrogen atoms to silicon atoms.

Following the above, in this embodiment, on the basis of effectively reducing the possibility that gate electrons jump into the gate insulating layer 22, a spacer layer 223 is further disposed in the gate insulating layer 22, and the pacer layer 223 has a relatively high deposition rate, thereby further reducing the process time of the display panel and increasing production capacity.

Figure 7:
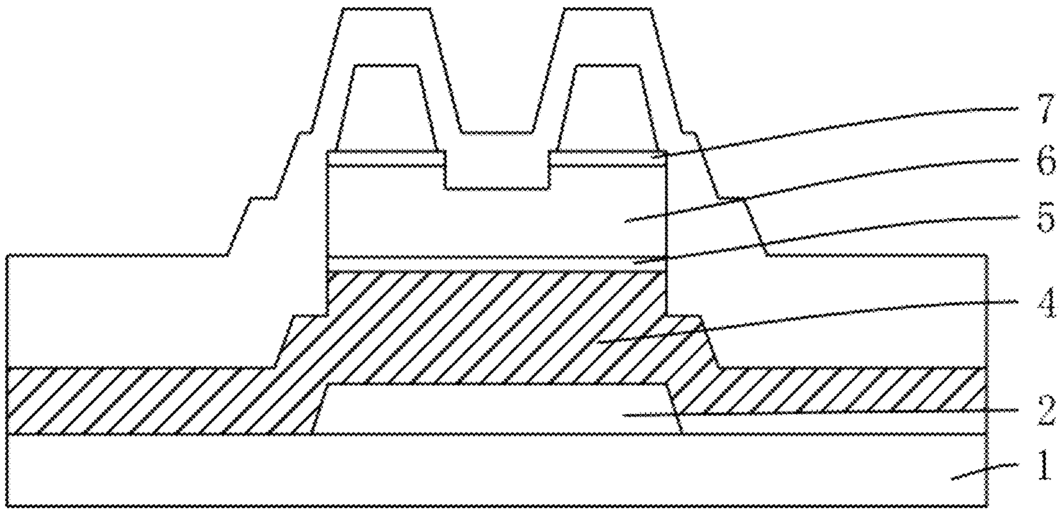
FIG. 7 is a schematic structural diagram of a structure of a display panel provided by another embodiment of the present disclosure.
Figure 8:
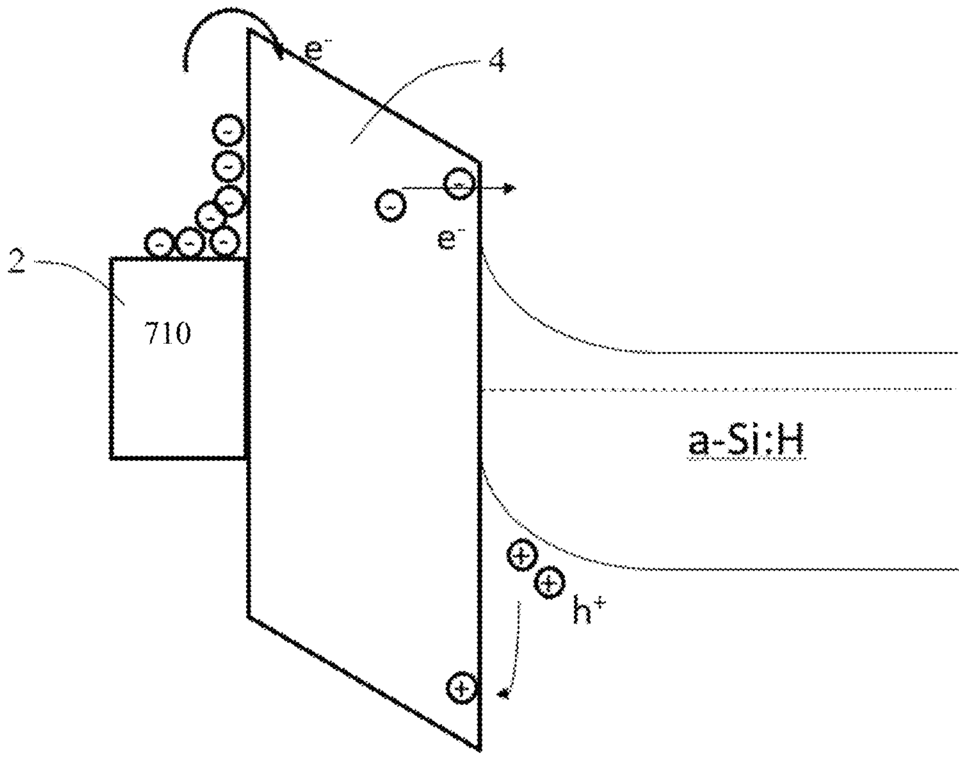
FIG. 8 is a schematic diagram of electronic transition of a gate insulating layer in a display panel provided by another embodiment of the present disclosure.

In addition, the strong light stability of the display panel shown in FIG. 1, the display panel shown in FIG. 3, the display panel shown in FIG. 5 and the display panel shown in FIG. 7 has been verified in embodiments of the present disclosure.

The display panel shown in FIG. 1 is set as Comparative Example 1. In this Comparative Example 1, the first insulating layer 3 has a thickness of 4700 angstroms and is deposited at a rate of 31 angstroms/second, and the second insulating layer 4 has a thickness of 300 angstroms and is deposited at a rate of 10 angstroms/second.

The display panel shown in FIG. 7 is set as Comparative Example 2, and the difference between this display panel and the display panel shown in FIG. 1 is in that: the entire gate insulating layer is deposited with the second insulating layer 4 with a relatively dense film layer structure, and the second insulating layer 4 has a thickness of 5000 angstroms and is deposited at a rate of 10 angstroms/second.

It should be noted that the gate insulating layers in Comparative Example 1, Comparative Example 2, Embodiment 1 and Embodiment 2 can respectively be deposited and manufactured by plasma enhanced chemical vapor deposition, and film layers in the display panels are the same except for the gate insulating layer.

Figure 9:
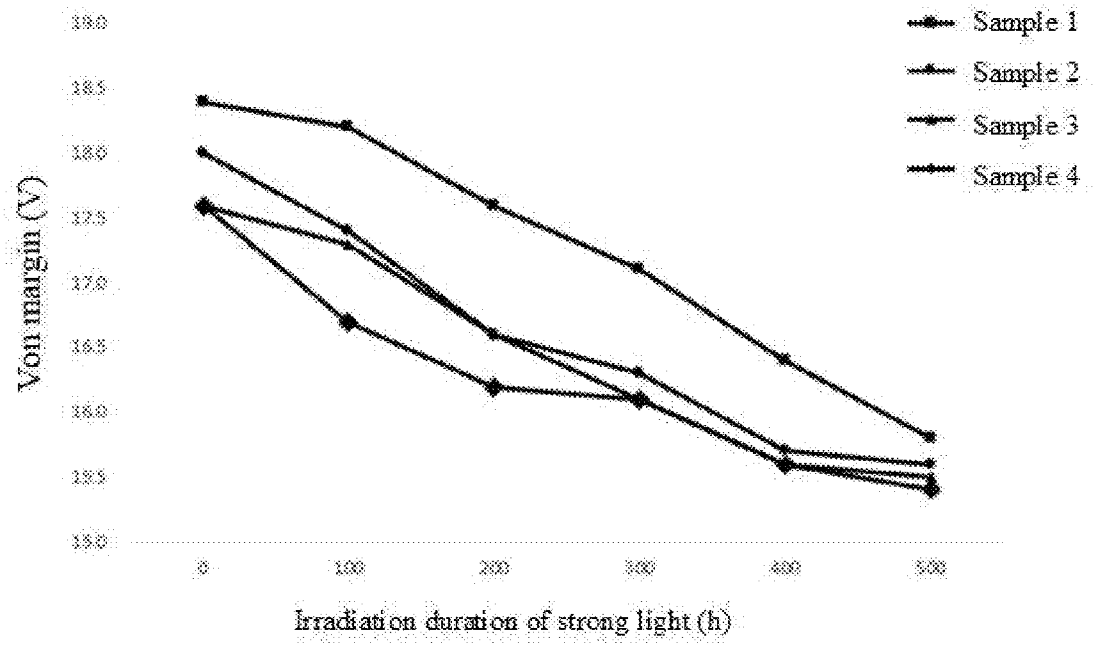
FIG. 9 to FIG. 12 are curves of strong light stability of display panels provided by some embodiments of the present disclosure.
Figure 10:
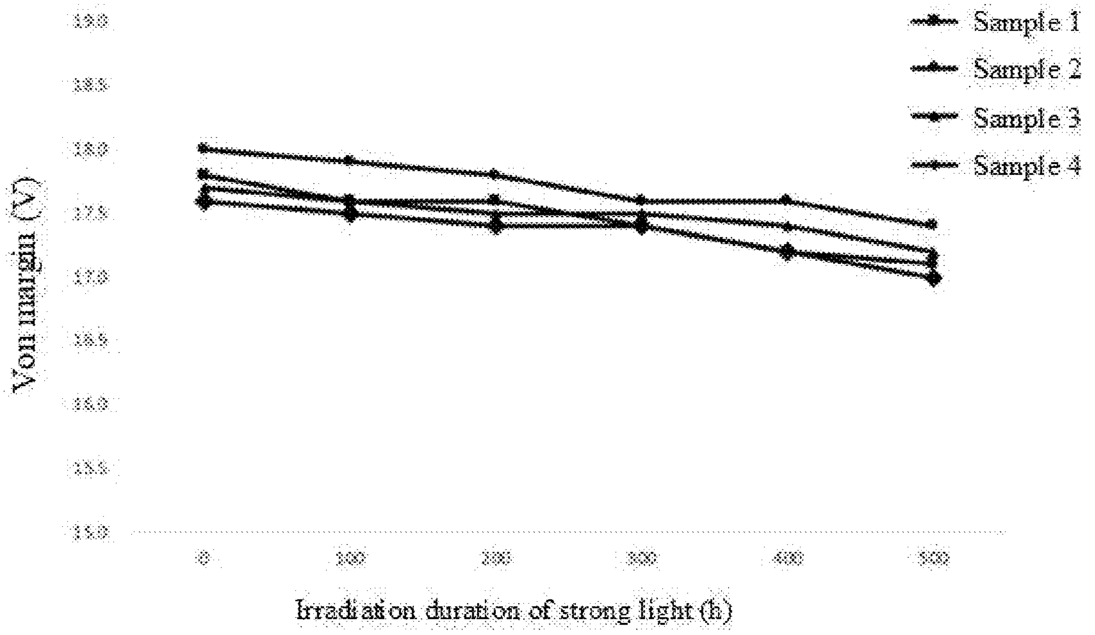
Figure 11:
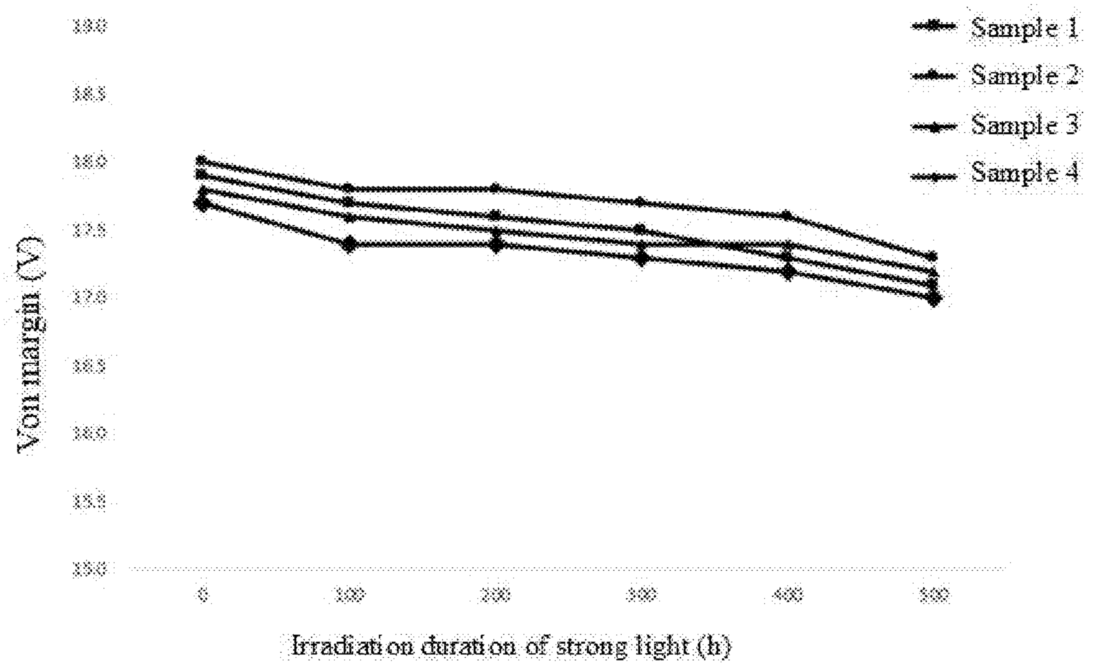
Figure 12:
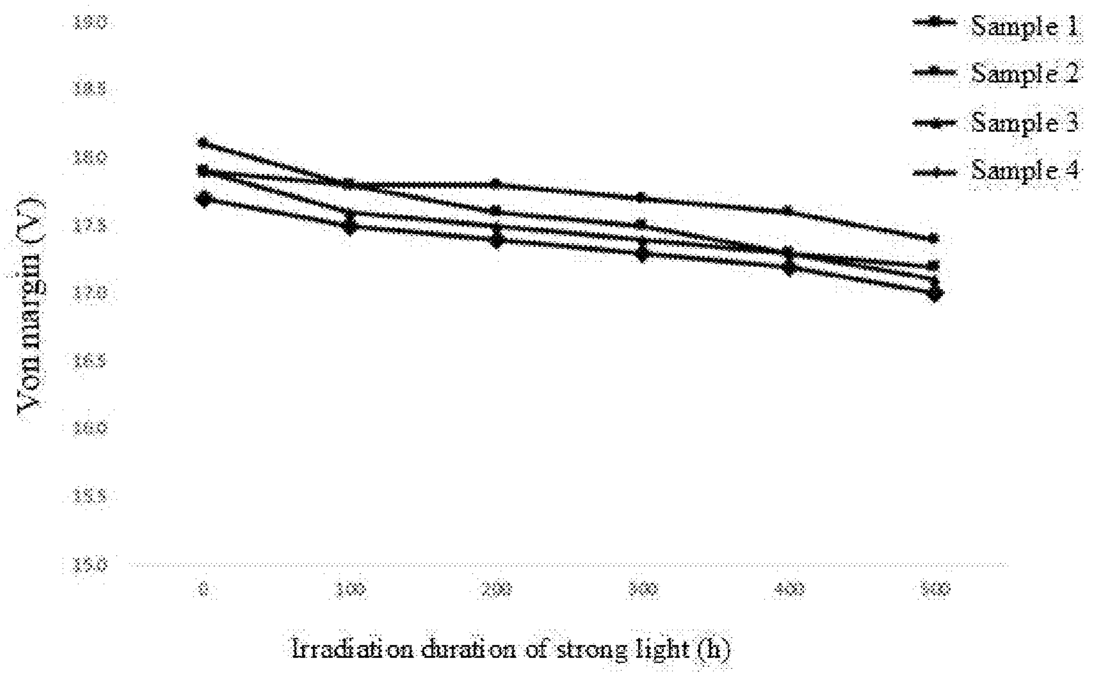

Next, at normal temperature, the display panels in Comparative Examples, Embodiment 1 and Embodiment 2 are irradiated with light having a brightness of 4 W nits, and the irradiation distance can range from 50 centimeters to 60 centimeters, the irradiation duration is 500 h, and curves of strong light stability of the display panels as shown in FIG. 9, FIG. 10, FIG. 11 and FIG. 12 are obtained. FIG. 9 is a curve corresponding to the display panel in Comparative Example 1, FIG. 12 is a curve corresponding to the display panel in Comparative Example 2, FIG. 10 is a curve corresponding to the display panel in Embodiment 1, and FIG. 11 is a curve corresponding to the display panel in Embodiment 2. Four sample display panels are used for verification in each of the curves.

Following the above, in FIG. 9 to FIG. 12, in which the abscissa represents the irradiation duration, and the ordinate represents Von margin, in which the calculation process of Von margin is as follows. Firstly, a voltage of 30V is applied to the gate to enable the display panel to glow, and an initial brightness at this time is recorded. Then the voltage applied on the gate is adjusted to load an adjustment voltage on the gate, such that the brightness of the display panel is 60% of the initial brightness, and then Von margin is equal to the difference obtained by subtracting the adjustment voltage from 30V.

Further, the following Table 1 is obtained according to the film layer parameters and verification results of performances of each of the Comparative Examples and Embodiments.

TABLE 1

Table of film layer parameters and verification results of performances

| | Comparative Example 1 | Embodiment 1 | Embodiment 2 | Comparative Example 2 |
|---|---|---|---|---|
| optical band gaps of the gate insulating layer (optical band gaps of each film layer from the gate upward in sequence) | 4.0/5.0 | 4.7/5.0 | 4.7/4.0/5.0 | 5.0 |
| ratio of nitrogen to silicon of the film layer contacting with the gate | 0.8~0.95 | 0.95~1.2 | 0.95~1.2 | 1.1~1.3 |
| productive capacity | high+ | high− | high | low |
| uniformity of film formation | poor | good | good− | good+ |
| strong light stability | poor | good | good | good |

The display panel shown in FIG. 3 is set as Embodiment 1. In this Embodiment 1, the electron suppressing layer 221 has a thickness of 4700 angstroms and is deposited at a rate of 27 angstroms/second, while the electron blocking layer 222 has a thickness of 300 angstroms and is deposited at a rate of 10 angstroms/second.

The display panel shown in FIG. 5 is set as Embodiment 2. In this Embodiment 2, the electron suppressing layer 221 has a thickness of 300 angstroms and is deposited at a rate of 27 angstroms/second, the spacer layer 223 has a thickness of 4200 angstroms and is deposited at a rate of 31 angstroms/second, and the electron blocking layer 222 has a thickness of 300 angstroms and is deposited at a rate of 10 angstroms/second.

It can be seen from Table 1 that, the ratio of nitrogen to silicon and optical band gap of the gate insulating layer in Comparative Example 1 are relatively small, and the uniformity of film formation and strong light stability are relatively poor. While the ratios of nitrogen to silicon and optical band gaps of the gate insulating layers in Comparative Example 2, Embodiment 1 and Embodiment 2 respectively are relatively large, and the uniformity of film formation and strong light stability are both relatively strong. Specifically, the smaller the attenuation amplitude of Von margin with the irradiation duration, the better the strong light stability of the corresponding display panel. As can be seen from FIG. 9 to FIG. 12, the attenuation amplitude of Von margin in Comparative Example 1 is about 13%, while the attenuation amplitude of Von margin in Embodiment 1, Embodiment 2 and Comparative Example 2 are merely within 2%, respectively. It can be seen that all of the display panels provided in Comparative Example 2, Embodiment 1 and Embodiment 2 of the present disclosure can effectively reduce the possibility that gate electrons jump into the gate insulating layer 22, thereby effectively improving the stability of the thin film transistor and the display panel, and improving the display effect of the display panel. In addition, although the display panel in Comparative Example 2 has a strong inhibitory effect on electron transition, the deposition rate of the gate insulating layer thereof is relatively slow, which will have a greater impact on production efficiency and cost. Compared with Comparative Example 2, the deposition rate of the gate insulating layers 22 in Embodiment 1 and Embodiment 2 can be effectively improved, which can effectively improve the production efficiency and reduce the cost. The display panels in Embodiment 1 and Embodiment 2 can also effectively reduce the possibility that gate electrons jump into the gate insulating layer 22, thereby effectively improving the stability of the thin film transistor and the display panel, and improving the display effect of the display panel.

Figure 13:
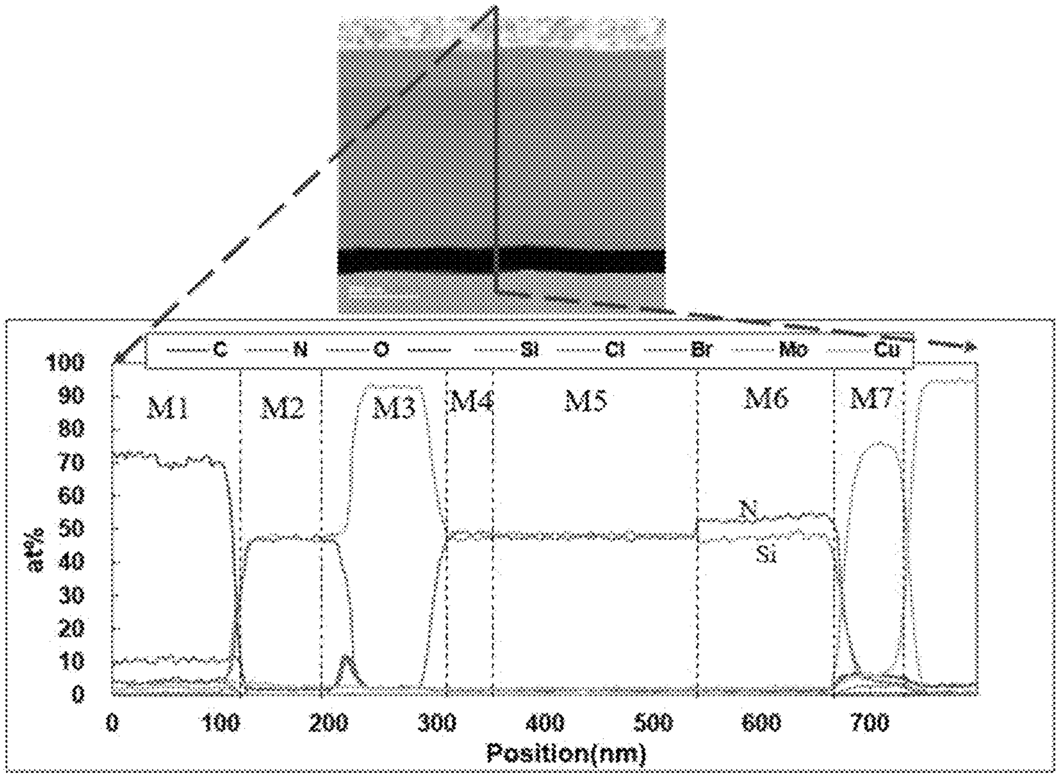
FIG. 13 is a curve of element detection of film layers in a display panel provided by an embodiment of the present disclosure.

Further, with reference to FIG. 5 and FIG. 13, structures of the display panel provided by some embodiments of the present disclosure can be analyzed through EDX element analysis, so as to verify and obtain the specific structure and element ratio of the display panel. Taking the display panel having a structure shown in FIG. 5 as an example, in which the abscissa in FIG. 13 represents the vertical depth, and the ordinate represents the percentage of atomic content. Segment M1 is the color resist layer on the thin film transistor layer 20, segment M2 is the interlayer dielectric layer 26, segment M3 is the active layer 23, segment M4 is the electron blocking layer 222, segment M5 is the spacer layer 223, and segment M6 is the electron suppressing layer 221. Element ratios in each film layer can be observed to verify the ratio of nitrogen to silicon of each film layer in the gate insulating layer 22 of the display panel provided by an embodiment of the present disclosure.

In summary, it can be seen from the above embodiments and FIG. 9 to FIG. 12 that, in some embodiments of the present disclosure, by adjusting the gate insulating layer 22 in the display panel and adding an electron suppressing layer 221 covering the gate 21, the possibility that gate electrons jump into the gate insulating layer 22 is effectively reduced, thereby avoiding the stability of the thin film transistor being affected by electronic transition, and improving the stability of the thin film transistor. In addition, a spacer layer 223 can be disposed between the electron suppressing layer 221 and the electron blocking layer 222, which can effectively increase the film deposition rate, so as to reduce the process time and increase productive capacity.

Figure 14:
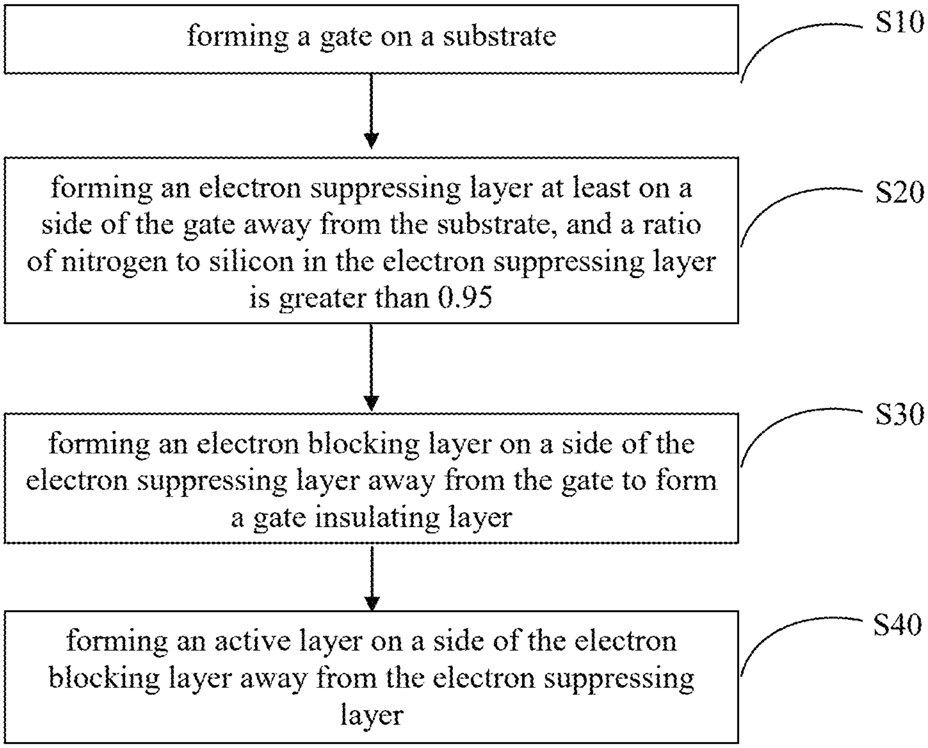
FIG. 14 is a flowchart of a method of manufacturing a display panel provided by an embodiment of the present disclosure.

Furthermore, an embodiment of the present disclosure also provides a method of manufacturing a display panel. Referring to FIG. 3, FIG. 5 and FIG. 14, the method of manufacturing a display panel includes the following steps.

S10, forming a gate 21 on a substrate 10.

S20, forming an electron suppressing layer 221 at least on a side of the gate 21 away from the substrate 10, and a ratio of nitrogen to silicon in the electron suppressing layer 221 is greater than 0.95.

S30, forming an electron blocking layer 222 on a side of the electron suppressing layer 221 away from the gate 21 to form a gate insulating layer 22.

S40, forming an active layer 23 on a side of the electron blocking layer 222 away from the electron suppressing layer 221.

In an embodiment, referring to FIG. 3 and FIG. 14, at step S10, the gate 21 is firstly formed on the substrate 10.

At step S20, a plasma enhanced chemical vapor deposition method may be used to deposit the electron suppressing layer 221 covering the gate 21 on the substrate 10, and a material of the electron suppressing layer 221 may include silicon nitride material. A ratio of nitrogen to silicon in the electron suppressing layer 221 is greater than 0.95.

At step S30, a plasma enhanced chemical vapor deposition method may be used to form the electron blocking layer 222 on a side of the electron suppressing layer 221 away from the gate 21 to form the gate insulating layer 22, and a material of the electron blocking layer 222 may include nitrogen material. A deposition rate of the electron blocking layer 222 is lower than a deposition rate of the electron suppressing layer 221.

At step S40, the active layer 23 is formed on a side of the electron blocking layer 222 away from the electron suppressing layer 221.

In addition, a source 24 and a drain 25 can also be formed on a side of the active layer 23 away from the gate insulating layer 22, and then an interlayer dielectric layer 26 covering the source 24, the drain 25, and the active layer 23 can also be formed, so as to form a thin film transistor layer 20 on the substrate 10.

In another embodiment, referring to FIG. 5 and FIG. 14, at step S10, the gate 21 is firstly formed on the substrate 10.

At step S20, a plasma enhanced chemical vapor deposition method may be used to deposit the electron suppressing layer 221 covering the gate 21 on the substrate 10, and a material of the electron suppressing layer 221 may include silicon nitride material, and a ratio of nitrogen to silicon in the electron suppressing layer 221 is greater than 0.95.

At step S30, a plasma enhanced chemical vapor deposition method may be used to sequentially form the spacer layer 223 and the electron blocking layer 222 on the side of the electron suppressing layer 221 away from the gate 21 to form the gate insulating layer 22. Materials of the spacer layer 223 and the electron blocking layer 222 may both include silicon nitride material. The deposition rate of the electron blocking layer 222 is lower than the deposition rate of the electron suppressing layer 221, the deposition rate of the electron suppressing layer 221 is lower than the deposition rate of the spacer layer 223. The ratio of nitrogen to silicon in the electron suppressing layer 221 is greater than the ratio of nitrogen to silicon in the spacer layer 223, such that the optical band gap of the electron suppressing layer 221 is greater than the optical band gap of the spacer layer 223.

At step S40, the active layer 23 is formed on the side of the electron blocking layer 222 away from the electron suppressing layer 221.

In addition, the source 24 and the drain 25 can also be formed on the side of the active layer 23 away from the gate insulating layer 22, and then an interlayer dielectric layer 26 covering the source 24, the drain 25, and the active layer 23 can also be formed to form the thin film transistor layer 20 on the substrate 10.

In summary, it can be seen from the above embodiments and FIG. 9 to FIG. 12 that, in embodiments of the present disclosure, by adjusting the gate insulating layer 22 in the display panel and adding an electron suppressing layer 221 covering the gate 21, the possibility that gate electrons jump into the gate insulating layer 22 can be effectively reduced, thereby avoiding the stability of the thin film transistor being affected by the electronic transition, and improving the stability of the thin film transistor. In addition, the spacer layer 223 can be disposed between the electron suppressing layer 221 and the electron blocking layer 222 to reduce the process time and increase productive capacity.

In addition, an embodiment of the present disclosure also provides a display device, and the display device includes the display panel described in any of the above embodiments.

The display device provided by an embodiment of the present disclosure may include a television, a mobile phone, a computer, a tablet, or a watch and other display apparatus.

Since the display device provided by an embodiment of the present disclosure is provided with the display panel provided by embodiments of the present disclosure, the display device has the same advantageous effect as the display panel mentioned above.

In the above embodiments, each embodiment is described with its own emphasis. For parts that are not described in detail in a certain embodiment, reference can be made to the relevant descriptions of other embodiments.

The display panel, method of manufacturing a display panel and the display device provided by some embodiments of the present disclosure are described in detail, principles and implementations of the present disclosure are illustrated with specific examples herein, and the above description of the embodiments is merely intended to help understand the technical solution and its core idea of the present disclosure. It should be understood that, a person skilled in the art may modify the technical solutions recorded in the foregoing embodiments, or to equivalently replace some of the technical features. However, these modifications or replacements do not cause the essence of the corresponding technical solution to depart from the scope of the technical solution of each embodiment of the present disclosure.

What is claimed is:

1. A display panel, wherein the display panel comprises a substrate and a thin film transistor layer disposed on the substrate, and the thin film transistor layer comprises:

a gate disposed on the substrate;

a gate insulating layer disposed on the substrate and covering the gate;

an active layer disposed on a side of the gate insulating layer away from the gate;

wherein the gate insulating layer comprises an electron suppressing layer at least covering a side of the gate away from the substrate and an electron blocking layer disposed on a side of the electron suppressing layer away from the gate, and a ratio of nitrogen to silicon in the electron suppressing layer is greater than 1 and less than or equal to 1.2.

2. The display panel according to claim 1, wherein the gate insulating layer further comprises a spacer layer disposed between the electron suppressing layer and the electron blocking layer, and a ratio of nitrogen to silicon in the spacer layer is less than the ratio of nitrogen to silicon in the electron suppressing layer, and the ratio of nitrogen to silicon in the electron suppressing layer is less than a ratio of nitrogen to silicon in the electron blocking layer.

3. The display panel according to claim 2, wherein a thickness of the electron suppressing layer is less than a thickness of the spacer layer, and the thickness of the electron suppressing layer is greater than or equal to a thickness of the electron blocking layer.

4. The display panel according to claim 2, wherein an optical band gap of the electron suppressing layer is greater than an optical band gap of the spacer layer, and is less than an optical band gap of the electron blocking layer.

5. The display panel according to claim 4, wherein the optical band gap of the electron suppressing layer is greater than or equal to 4.3.

6. The display panel according to claim 2, wherein the ratio of nitrogen to silicon in the spacer layer is less than or equal to 0.95 and greater than or equal to 0.8, and an optical band gap of the spacer layer is 4.

7. The display panel according to claim 2, wherein an optical band gap of the electron suppressing layer is greater than or equal to 4.7.

8. The display panel according to claim 1, wherein an optical band gap of the electron suppressing layer is greater than or equal to 4.3.

9. The display panel according to claim 1, wherein a material of the gate insulating layer comprises silicon nitride material.

10. The display panel according to claim 1, wherein a ratio of nitrogen to silicon the electron suppressing layer is greater or equal than 1.1 and less than or equal to 1.2.

11. A method of manufacturing a display panel, comprising:

forming a gate on a substrate;

forming an electron suppressing layer at least on a side of the gate away from the substrate, and a ratio of nitrogen to silicon in the electron suppressing layer is greater than 1 and less than or equal to 1.2;

forming an electron blocking layer on a side of the electron suppressing layer away from the gate to form a gate insulating layer;

forming an active layer on a side of the electron blocking layer away from the electron suppressing layer.

12. The method for manufacturing a display panel according to claim 11, wherein forming an electron suppressing layer at least on a side of the gate away from the substrate further comprises:

depositing a spacer layer on the side of the electron suppressing layer away from the gate, and the ratio of nitrogen to silicon in the electron suppressing layer is greater than a ratio of nitrogen to silicon in the spacer layer;

wherein the electron suppressing layer is at least deposited on the side of the gate away from the substrate, and a deposition rate of the electron suppressing layer is lower than a deposition rate of the spacer layer.

13. A display device, wherein the display device comprises a display panel, the display panel comprises a substrate and a thin film transistor layer disposed on the substrate, and the thin film transistor layer comprises:

a gate disposed on the substrate;

a gate insulating layer disposed on the substrate and covering the gate;

an active layer disposed on a side of the gate insulating layer away from the gate;

wherein the gate insulating layer comprises an electron suppressing layer at least covering a side of the gate away from the substrate and an electron blocking layer disposed on a side of the electron suppressing layer away from the gate, and a ratio of nitrogen to silicon in the electron suppressing layer is greater than 1 and less than or equal to 1.2.

14. The display device according to claim 13, wherein the gate insulating layer further comprises a spacer layer disposed between the electron suppressing layer and the electron blocking layer, and a ratio of nitrogen to silicon in the spacer layer is less than the ratio of nitrogen to silicon in the electron suppressing layer, and the ratio of nitrogen to silicon in the electron suppressing layer is less than a ratio of nitrogen to silicon in the electron blocking layer.

15. The display device according to claim 14, wherein a thickness of the electron suppressing layer is less than a thickness of the spacer layer, and the thickness of the electron suppressing layer is greater than or equal to a thickness of the electron blocking layer.

16. The display device according to claim 14, wherein an optical band gap of the electron suppressing layer is greater than an optical band gap of the spacer layer, and is less than an optical band gap of the electron blocking layer.

17. The display device according to claim 16, wherein the optical band gap of the electron suppressing layer is greater than or equal to 4.3.

18. The display device according to claim 13, wherein an optical band gap of the electron suppressing layer is greater than or equal to 4.3.

* * * * *